(12) United States Patent
Hironaka

(10) Patent No.: US 11,062,884 B2
(45) Date of Patent: Jul. 13, 2021

(54) PLASMA PROCESSING APPARATUS AND PLASMA PROCESSING METHOD

(71) Applicant: HITACHI HIGH-TECH CORPORATION, Tokyo (JP)

(72) Inventor: Yoshiyuki Hironaka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 25 days.

(21) Appl. No.: 16/287,814

(22) Filed: Feb. 27, 2019

(65) Prior Publication Data
US 2019/0393021 A1  Dec. 26, 2019

(30) Foreign Application Priority Data

Jun. 26, 2018 (JP) .............................. JP2018-120390

(51) Int. Cl.
*H05K 3/00* (2006.01)
*H01L 21/3065* (2006.01)
(Continued)

(52) U.S. Cl.
CPC .. *H01J 37/32577* (2013.01); *H01J 37/32128* (2013.01); *H01J 37/32183* (2013.01); *H01J 37/32541* (2013.01); *H01J 37/32678* (2013.01); *H01L 21/306* (2013.01); *H01L 21/3065* (2013.01); *H01L 21/30604* (2013.01); *H01L 21/30621* (2013.01); *B81C 1/00531* (2013.01); *H01J 2237/3341* (2013.01); *H05K 3/0041* (2013.01)

(58) Field of Classification Search
None
See application file for complete search history.

(56) References Cited

U.S. PATENT DOCUMENTS 8,920,665 B2 * 12/2014 Sato ................. H01J 37/32577
216/67

FOREIGN PATENT DOCUMENTS

JP 2005-071872 A 3/2005
JP 2005071872 A * 3/2005 ............... H03H 7/40
(Continued)

*Primary Examiner* — Stephanie P Duclair
(74) *Attorney, Agent, or Firm* — Miles & Stockbridge, P.C.

(57) ABSTRACT

The present invention provides a plasma processing apparatus and a plasma processing method which improve the uniformity and accordingly the yield in an etching treatment of a sample. In the plasma processing apparatus or the plasma processing method for treating a wafer placed on an upper surface of a sample table disposed in a treatment chamber in a vacuum container by using plasma generated in the treatment chamber, inductance of the coil is adjusted according to magnitude of an phase difference of the high frequency power flowing through the power supply path such that the voltage of the high frequency power becomes a maximum value or a minimum value, in which the coil is in a connection path that electrically connects, via the coil, positions between each electrode and each matching box on a plurality of power supply paths that electrically connect a plurality of electrodes and a plurality of electrodes high frequency power sources which supply high frequency power to the plurality of electrodes disposed at a center part and an area on an outer peripheral side of the center part in the sample table.

4 Claims, 4 Drawing Sheets

(51) Int. Cl.
  *H01L 21/306* (2006.01)
  *H01J 37/32* (2006.01)
  *B81C 1/00* (2006.01)

(56) References Cited

FOREIGN PATENT DOCUMENTS

JP  2007-067037 A   3/2007
JP  5198616   *   9/2011   ......... H01L 21/3065

* cited by examiner

PLASMA PROCESSING APPARATUS AND PLASMA PROCESSING METHOD

CROSS-REFERENCE TO RELATED APPLICATIONS

The present application claims priority to Japanese Patent Application No. 2018-120390, filed Jun. 26, 2018. The contents of this application are incorporated herein by reference in their entirety.

BACKGROUND OF THE INVENTION

1. Field of the Invention

The present invention relates to a plasma processing apparatus or a plasma processing method for treating or processing a sample like a semiconductor wafer or substrate placed on an upper surface of a sample table disposed in a treatment chamber in a vacuum container by using plasma generated in the treatment chamber, and particularly to a plasma processing apparatus or a plasma processing method for treating a film layer to be treated formed in advance on a surface of a sample by generating plasma and supplying high frequency power to an electrode disposed inside a sample table.

2. Description of the Related Art

In related art, in order to manufacture a semiconductor device, treatments are performed in which a circuit structure of the semiconductor device is formed by performing an etching treatment, using plasma, on a film structure which includes a mask layer formed in advance on an upper surface of a substrate-shaped sample such as a semiconductor wafer and a film layer to be treated disposed below the mask layer. Such a technique for etching treatment generally includes, for example, generating a bias potential above the upper surface of the sample that is placed and held on an upper surface of a sample table by supplying high frequency power to an electrode disposed in the sample table in a treatment chamber, and causing charged particles such as ions in plasma to act on the film layer to be treated on a sample surface with high efficiency.

Furthermore, along with the improvement in element integration degree in recent years, improvement in precision of fine treatment is required, and it is also required that a speed (etching rate) in a direction in which an etching operation advances in an in-plane direction of a semiconductor wafer should be made more uniform, and that variations in dimensions of the film structure that is a treatment result obtained after the wafer is treated should be reduced.

The treatment distribution in the in-plane direction of the sample is influenced by a plurality of factors in the treatment, such as the density and temperature of the plasma generated inside a treatment chamber, or the distribution of energy when the ions generated in the plasma are incident on the sample surface. Here, in order to reduce the variations in the treatment of the sample surface, it has been considered in the related art to appropriately adjust the magnitude of the high frequency power in the in-plane direction of the electrode in the sample table or the sample placed on the upper surface of the sample table, as well as the distribution of the bias potential formed above the sample surface through the high frequency power.

As an example of such a technique, for example, one disclosed in JP-A-2007-67037 (Patent Document 1) has been known. In the related art technique, a sample table having a substantially cylindrical shape is divided into a plurality of concentric areas from a vertical center axis in a radial direction, and a plurality of circular arc-shaped areas with equal angles from the center in a circumferential direction of each concentric area, and the temperature of each area and each voltage amplitude (peak-to-peak, hereinafter referred to as Vpp) of high frequency power supplied to an electrode disposed in each area are independently adjusted, so that treatment characteristics of a sample surface above each area of the sample table in the treatment is adjusted independently and variations of a treatment result in the in-plane direction of the sample surface is reduced, thereby improving the uniformity.

As in Patent Document 1, in a configuration in which a plurality of electrodes are adjacently disposed in the radial direction or the circumferential direction of the inner part of the sample table, stray capacitance occurs between the electrodes, and the electrodes are connected by a capacitor as an equivalent circuit. In such configuration, a part of the high frequency power supplied from one electrode may flow to another electrode via the stray capacitance of the capacitor and cause mutual interference, and the magnitude of the high frequency power supplied from the electrode whose reflected power is reduced via a matching box, and the result of the treatment deviate from desired ones.

In order to solve such problems, the following configuration has been considered. High frequency power is connected to each of two electrodes adjacently disposed inside a plasma processing apparatus via a matching box, power supply paths to which the high frequency power is supplied are electrically connected via inductive elements or variable inductive elements that have predetermined inductance magnitude, and a current of the high frequency power flowing from one electrode to another electrode by the stray capacitance is countered by a complex current of an inductive element with a different phase, so that mutual interference between the electrodes can be prevented. As an example of such related art technique, for example, one disclosed in JP-A-2005-71872 (Patent Document 2) has been known.

PRIOR ART DOCUMENT

Patent Document

Patent Document 1: JP-A-2007-67037
Patent Document 1: JP-A-2005-71872

SUMMARY OF THE INVENTION

Problems to be Solved by the Invention

However, in the related art, problems may occur since consideration on the following points is insufficient.

In Patent Document 1, due to the influence of the mutual interference caused by the stray capacitance between adjacent electrodes of the divided electrodes, the difference Vpp between these electrodes is deviated from the expected one. For example, even if the high frequency power is fed so as to adjust magnitude of a corrected voltage according to the amount of the deviation, since the magnitude of the stray capacitances also differs between a plurality of adjacent pairs of electrodes in the plurality of sample tables or the same sample table, it takes too much time and effort in calibration of adjusting the voltage of each electrode according to the stray capacitance individually, and therefore, the efficiency in installing and operating a plasma processing apparatus is impaired.

In Patent Document 2, although Vpp of power supplied to each of the two adjacent electrodes can approach the expected Vpp, it is hard to accurately adjust a power value to be output from two power sources which are respectively connected to the electrodes when these power sources are used to output at the same time. For example, in the etching treatment on the sample such as a semiconductor wafer for manufacturing semiconductor devices in recent years, during the treatment of the sample, an operation in which high frequency power to be supplied to an electrode in the sample table is supplied with a voltage or a current of a relatively large predetermined value during a predetermined period, and then is supplied with a voltage or a current of a relatively small predetermined value or zero during another predetermined period, is taken as one cycle and the cycle is repeated for a plurality of times, so that an bias potential generated above an upper surface of the sample is changed periodically, thereby improving the accuracy of the treatment of the sample.

Further, by appropriately adjusting, according to treatment conditions, power supply parameters such as a ratio (so-called duty ratio) of a period during which a voltage or current value of the high frequency power is larger to a period during which the voltage or current value is smaller or zero in one cycle, or ratios of the voltages or currents in each period, and by differentiating between two adjacent electrodes, it is possible to produce a desired height distribution of an equal potential plane of the bias potential in an axial direction or circumferential direction of the sample, so as to improve the accuracy of the treatment.

In a configuration of Patent Document 2, in a case where the high frequency power is supplied with a periodically changed magnitude, etching rate of a film layer to be treated on the upper surface of the sample is influenced in a state where the high frequency power is output only from one power source. Further, in a case where the high frequency power, which is coupled to plasma generated in a space above the sample table inside the plasma processing apparatus and is supplied to the electrodes, is output from only one power source and in a case where the high frequency power is output from two power sources, conditions such as distribution of the bias potential above the upper surface of the sample and distribution of plasma potential and ions are different, and accordingly, appropriate values of the inductive elements disposed between the power supply circuits are also different and the deviation of Vpp of the high frequency power at each electrode from the expected one is large. For this reason, the problem that the yield of the treatment of the sample is impaired has not been considered in the related art described above.

An object of the invention is to provide a plasma processing apparatus and a plasma processing method which improve the uniformity and accordingly the yield in an etching treatment of a sample.

Means for Solving the Problems

The object is achieved by a plasma processing apparatus and a plasma processing method for treating a wafer placed on an upper surface of a sample table disposed in a treatment chamber in a vacuum container by using plasma generated in the treatment chamber, in which inductance of a coil is adjusted according to magnitude of a phase difference of the high frequency power flowing through the power supply path such that the voltage of the high frequency power becomes a maximum value or a minimum value, and the coil is in a connection path that electrically connects, via the coil, positions between each electrode and each matching box on two power supply paths that electrically connect two electrodes and two frequency power sources which supply high frequency power to the two electrodes disposed at a center part and an area on an outer peripheral side of the center part in the sample table.

Effect of the Invention

According to the invention, a plasma processing apparatus and a plasma processing method which improve the uniformity and accordingly the yield in an etching treatment of a sample can be provided.

DESCRIPTION OF THE PREFERRED EMBODIMENTS

Hereinafter, an example for carrying out the invention will be described with reference to an embodiment.

Embodiment 1

Figure 1:
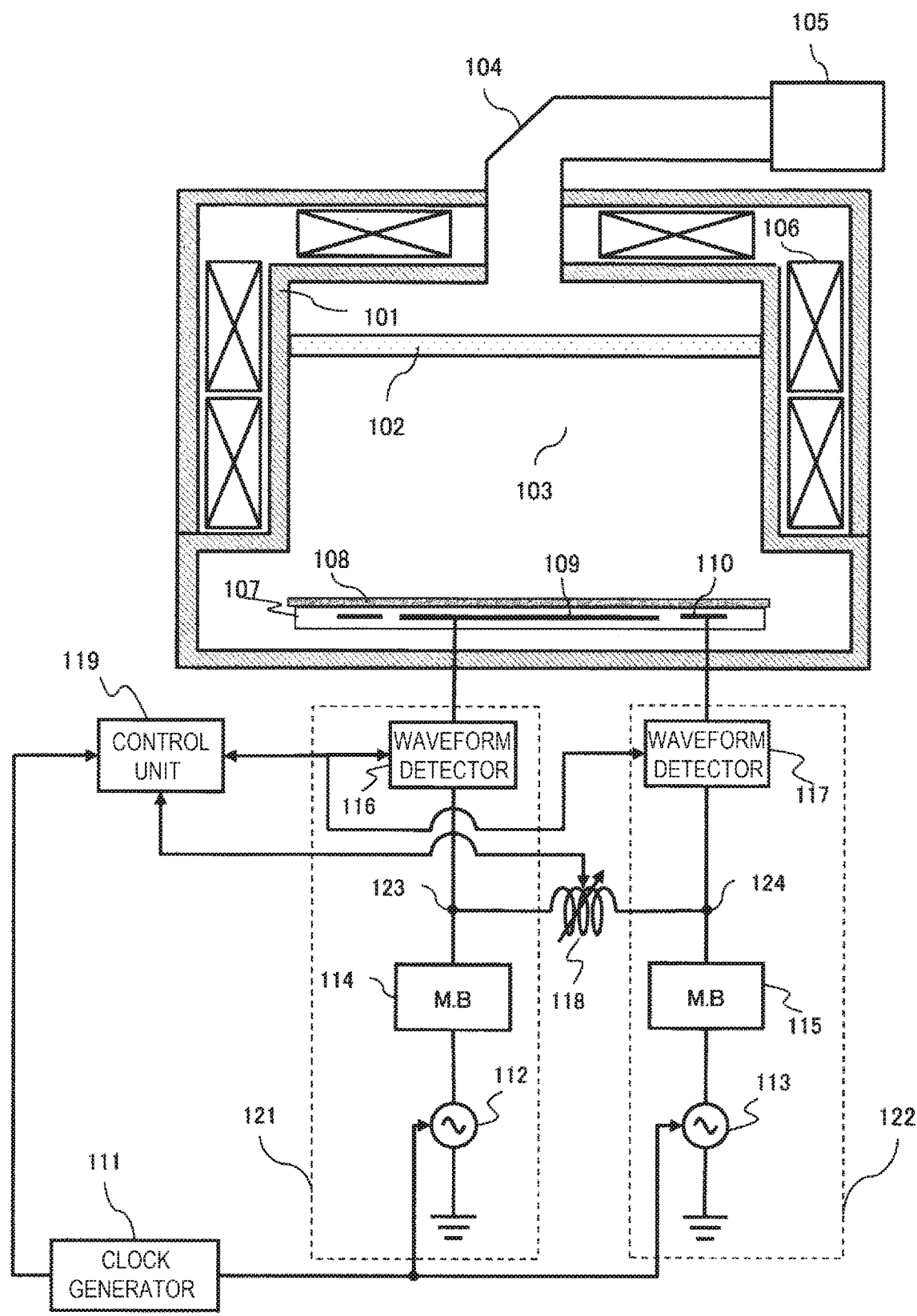
FIG. 1 is a longitudinal sectional view schematically illustrating an outline of a configuration of a plasma processing apparatus according to an embodiment of the invention.

The embodiment of the invention will be described with reference to FIG. 1 to FIG. 4. FIG. 1 is a longitudinal sectional view schematically illustrating an outline of a configuration of a plasma processing apparatus according to the embodiment of the invention. The plasma processing apparatus of the present embodiment supplies an electric field and a magnetic field for generating plasma in a treatment chamber disposed inside a vacuum container, efficiently generates the plasma by resonating (Electron Cyclotron Resonance: ECR) movements of electrons through an interaction of the electric field and the magnetic field, and performs an etching treatment on a film layer to be treated having a film structure which includes a mask layer formed in advance on an upper surface of a substrate-shaped sample such as a semiconductor wafer disposed in the treatment chamber and the film layer to be treated stacked below the mask layer.

A plasma processing apparatus 100 of the embodiment includes: a vacuum container 101 that includes a cylindrical treatment chamber 103 therein; a plasma generation unit that produces an electric field and a magnetic field, which are supplied to generate plasma inside the treatment chamber 103, at an upper side of the vacuum container 101 and around an outer side of a side wall of the vacuum container 101 at least a part of which has a cylindrical shape; and a vacuum evacuation unit (not shown) that includes a vacuum pump such as a turbo molecular pump and a roughing rotary pump connected to a lower side of a lower surface of the vacuum container 101 to evacuate the treatment chamber 103. In the embodiment, at least an upper part of the treatment chamber 103 is a space having a cylindrical shape, and at an upper side of the cylinder-shaped part, a dielectric window 102 having a circular plate shape and formed by dielectrics such as quartz that is capable of transmitting an electric field is disposed to configure an upper part of the vacuum container 101. The dielectric window 102 is connected to upper part surfaces of the side walls of the vacuum container 101 with seal members (not shown) such as O-rings interposed therebetween to hermetically seal an inside and outside of the treatment chamber 103. Further, at a lower side of a lower surface of the dielectric window 102, a circular plate-shaped shower plate on which a plurality of gas introduction holes that are through holes for introducing a treatment gas to be supplied into the treatment chamber is disposed, and an upper side of the treatment chamber 103 is covered to configure a ceiling surface.

A waveguide 104 used to supply the electric field for generating the plasma to the treatment chamber 103 is disposed at the upper side of the treatment chamber 103 with the dielectric window 102 interposed therebetween. The waveguide 104 of the embodiment includes a circular waveguide portion having a cylindrical shape and a rectangular waveguide portion. The circular waveguide portion is disposed at an upper side of a cavity part that takes the dielectric window 102 as a bottom surface and has a cylindrical shape at an upper side of the dielectric window 102; and has a diameter smaller than that of the cavity part. A lower end part, whose cross section is circular, of the circular waveguide portion is connected to the cavity part. The rectangular waveguide portion has a rectangular or square cross section, and an axis thereof extends in a horizontal direction. An end part of the rectangular waveguide portion is connected to an upper end part of the circular waveguide portion.

An operation of the plasma processing apparatus 100 according to the embodiment is not particularly limited by a frequency of the electric field, and a microwave of 2.45 GHz is used in the embodiment. An electric field of a microwave band for generating the plasma inside the treatment chamber 103 is produced by oscillation by means of a magnetron power source 105, which is a high frequency power source disposed at another end part of the rectangular waveguide portion, and is supplied to the treatment chamber 103 after passing through the rectangular waveguide portion, transmitting through the circular waveguide portion toward an lower side, passing through the cavity part and penetrating the dielectric window 102.

A plurality of solenoid coils 106 that produce the magnetic field supplied into the treatment chamber 103 are arranged at the upper side and outer sides of lateral sides of the treatment chamber 103 so as to surround the treatment chamber 103. The magnetic field is produced by supplying a direct current to the solenoid coils 106. Due to the ECR produced by an interaction between the electric field of the microwave supplied from the waveguide 104 into the treatment chamber 103 and the magnetic field produced by the solenoid coils 106, atoms or molecules of the treatment gas introduced from the gas introduction holes into the treatment chamber 103 are excited, disassociated and ionized, so as to generate a high density plasma inside the treatment chamber 103.

A cylinder-shaped sample placement electrode 107 which is a sample table for placing the sample is disposed at a lower side of a space in which the plasma is generated inside the treatment chamber 103. A wafer 108 that is the sample is disposed and held on an upper surface of the sample placement electrode 107 covered by a dielectric film made of ceramics such as an aluminum oxide or an yttrium oxide.

In the embodiment, the wafer 108 has a circular plate shape or a similar shape that can be regarded as a circular plate shape. In order to reduce a rate of the etching treatment on the wafer 108 and variations in a radial direction or a circumferential direction from the center of the wafer 108 in a shape after the treatment so as to bring an distribution of treatment characteristics closer to uniformity, the wafer 108, the cylinder-shaped sample placement electrode 107 and the treatment chamber 103 are placed in positions where vertical axes thereof are coincident with each other or similar positions where the vertical axes thereof can be regarded as coincident with each other. The same applies to the solenoid coils 106 that surround outer periphery of the upper side and lateral sides of the treatment chamber 103.

A plurality of film-like electrodes formed by thermal spraying and to which a direct current is supplied are disposed in the dielectric film covering the upper surface of the sample placement electrode 107. Due to the direct current supplied to the plurality of film-like electrodes, corresponding electric charges are produced between the dielectric film member disposed at an upper side of the plurality of film-like electrodes and the wafer 108 disposed at an upper side of the dielectric film member in response to the direct current, and the wafer 108 is attracted and held toward the dielectric film by an electrostatic force generated by the electric charges.

In the embodiment, the plurality of film-like electrodes for attraction are disposed inside the dielectric film, at least two of the electrodes for attraction are electrically connected to different direct current power sources respectively, and therefore different polarities are imparted to the at least two electrodes for attraction by power from the direct current power sources respectively, thereby electrostatically attracting the wafer 108 onto the dielectric film. In the embodiment, the number or shape of such a film-like electrode for attraction is not particularly limited. The plasma processing apparatus 100 of the embodiment includes: a center side electrode 109 that is disposed at an center side of the upper surface of the wafer 108 or the sample placement electrode 107 covered by the dielectric film, and has a circular plate or ring-shaped upper surface when viewed from the upper side; and an outer peripheral side electrode 110 that is disposed at an outer peripheral side of the center side electrode 109 in a ring shape surrounding the center side electrode 109.

In the plasma processing apparatus 100 of the embodiment, a vacuum carrier container (not shown), which is another vacuum container and is depressurized to a predetermined degree of vacuum, is connected to the side wall of the vacuum container 101 so that the treatment chamber 103 and a carrier chamber can communicate with each other, and the wafer 108 to be treated is carried to the carrier chamber in the vacuum carrier container. A through hole is disposed on the side wall of the vacuum container 101 and a side wall of the vacuum carrier container connected thereto. The through hole configures a gate that is a passage for carrying the wafer 108 between the internal treatment chamber 103 and the carrier chamber in with a state where both of the side walls are connected. Further, a gate valve is provided in the carrier chamber. The gate valve contacts an inner side wall around an opening of the gate to hermetically seal an inside of the passage of the gate from the carrier chamber, and is detached from the inner side wall and is moved upward or downward to open the gate so as to communicate with the carrier chamber.

The wafer 108 to be treated is placed at a tip end part of a wafer-carrying mechanical arm (not shown), such as a robot arm, which is disposed inside the carrier chamber of the vacuum carrier container, and is carried to the upper side of the sample placement electrode 107 inside the treatment chamber 103 by the extension of the arm after passing through the gate opened by the gate valve. A plurality of pins which are stored inside the sample placement electrode 107 are moved to the upper side of the sample placement electrode 107 so as to receive the wafer 108 on tip ends of the pins, and the plurality of pins are moved again to an lower side to be stored inside the sample placement electrode 107 after the arm is retracted and out of the treatment chamber 103, so that the wafer 108 is placed on the dielectric film on the upper surface of the sample placement electrode 107.

Thereafter, when the gate is sealed by the gate valve again to seal the treatment chamber 103, the interior of the treatment chamber 103 is depressurized to a higher degree of vacuum, and then the treatment gas is introduced into the treatment chamber while the wafer 108 is electrostatically attracted onto the dielectric film, and the interior of the treatment chamber 103 is maintained at a pressure suitable for starting plasma generation and treatment. The electric field from the waveguide 104 and the magnetic field produced by the solenoid coils 106 are supplied into the treatment chamber 103 to produce the ECR; the treatment gas is excited, disassociated and ionized; and the plasma is generated inside the treatment chamber by using the treatment gas. By supplying the high frequency power to the center side electrode 109 and the outer peripheral side electrode 110 that are disposed inside the sample placement electrode 107, charged particles such as ions in the plasma are attracted to and collide with the upper surface of the wafer 108 due to a potential difference between a bias potential formed at the upper side of the upper surface of the wafer 108 and a potential in the plasma, and thereby performing an etching treatment on the film layer to be treated of a film structure formed in advance on the upper surface of the wafer 108.

When it is determined that the etching treatment of the wafer 108 has arrived to an end point based on an operation of an end point determining device (not shown), the supply of the electric field and the magnetic field is stopped and the plasma is digested, and then the supply of the high frequency power to the sample placement electrode 107 is stopped and the etching treatment is stopped. After the electrostatic attraction of the wafer 108 is released, the plurality of pins move upward to separate the wafer 108 from the upper surface of the sample placement electrode 107, and in a state where the wafer 108 is lifted to the upper side, the arm of the robot arm passes through the gate opened by the gate valve and enters the treatment chamber 103 again, so that the wafer 108 is delivered to the tip end part of the arm. After the wafer 108 is carried away from the treatment chamber 103 accompanying the retraction of the arm, in a case where there is a wafer 108 to be treated next, the wafer 108 is carried into the treatment chamber 103 and the above operations are repeated; and in a case where there is no wafer 108 to be treated, the operation of the plasma processing apparatus 100 on treating the wafer 108 for manufacturing the semiconductor device is stopped.

In the plasma processing apparatus 100 according to the embodiment, the magnetron power source 105 and the solenoid coils 106, the electrodes and the pins in the sample placement electrode 107, or devices (not shown) such as a high frequency bias supply circuit for producing a BIAS potential which is to be described below, the end point determining device and the robot arm all operate based on instruction signals transmitted from a control unit 119 of the plasma processing apparatus 100. The control unit 119 is connected to the devices so as to transmit and receive signals therebetween. The control unit 119 of the embodiment includes: an interface unit that transmits and receives the signals; a storage unit that stores received signals; and an arithmetic unit, such as an MPU, that calculates other data or an instruction signal according to data indicated by signals or data stored in the storage unit, based on an algorithm described by software stored in the storage unit. The interface unit, the storage unit and the arithmetic unit are communicably and electrically connected. The control unit 119 may have a configuration in which the interface unit, the storage unit and the arithmetic unit configuring the control unit 119 are disposed at different positions as semiconductor devices and circuits, and are connected with each other via a communication path, and the control unit 119 may also configured as a single semiconductor device in which the interface unit, the storage unit, the arithmetic unit and the communication path are housed.

The center side electrode 109 and the outer peripheral side electrode 110, which are built in the dielectric film configuring the upper surface of the sample placement electrode 107 of the plasma processing apparatus 100, are electrically connected to a first high frequency bias supply circuit 121 having a first high frequency bias power source 112 and a second high frequency bias supply circuit 122 having a second high frequency bias power source 113 respectively. That is, the center side electrode 109 is connected to the first high frequency bias supply circuit 121 in which the first high frequency bias power source 112 for supplying a high frequency bias power to produce a bias potential at the upper side of the center part of the wafer 108, a first waveform detector 116 for dividing an applied voltage and outputting the applied voltage as a voltage waveform signal, and a first automatic matching box 114 for performing impedance matching with the center side electrode 109 are sequentially connected by a coaxial cable configuring a power supply path and connector sections at both ends of the coaxial cable. The outer peripheral side electrode 110 is connected to the second high frequency bias supply circuit 122 in which the second high frequency bias power source 113 for supplying a high frequency bias power to produce a bias potential at an upper side of an outer peripheral part of the wafer 108, a second waveform detector 117 for dividing an applied voltage and outputting the applied voltage as a voltage waveform signal, and a second automatic matching box 115 for performing impedance matching with the outer peripheral side electrode 110 are sequentially connected by a coaxial cable configuring a power supply path and connector sections at both ends of the coaxial cable.

Here, the first high frequency power source 112 and the second high frequency power source 113 are connected to an electrode that is set to ground potential separately. Further, the first high frequency power source 112 and the second high frequency power source 113 are communicably connected to a clock generator 111, so as to receive clock signals output from the clock generator 111 at a predetermined period, and output high frequency bias power of a predetermined magnitude in synchronization with reception of the clock signals. The effect of the embodiment is not limited by the frequency of the high frequency power for producing the bias potential, and high frequency power of 400 kHz is used in the embodiment.

The first high frequency bias supply circuit 121 and the second high frequency bias supply circuit 122 are electrically separated from each other by an inter-electrode circuit 118 disposed in the middle of the power supply paths between the respective automatic matching boxes and the respective waveform detectors configuring the first high frequency bias supply circuit 121 and the second high frequency bias supply circuit 122. The inter-electrode circuit 118 of the embodiment is connected to the control unit 119 so as to communicate an electrical signal, and includes a variable inductance coil whose inductance value can be variably adjusted according to a coil adjustment signal transmitted from the control unit 119.

In the first high frequency bias supply circuit 121, a value of the voltage supplied to the center side electrode 109 via the first waveform detector 116 is equal to a value of the voltage output from the first high frequency bias power source 112 in a case where an electrical separation between the first high frequency bias supply circuit 121 and the second high frequency bias supply circuit 122 sandwiching the inter-electrode circuit 118 is ideally realized. However, in a case where the electrical separation is not ideal, the value of the voltage supplied to the center side electrode 109 is a value of a voltage at a position 123 when only the first high frequency bias power source 112 is outputting superimposed on a voltage at the position 123 when only the second high frequency bias power source 113 is outputting. The position 123 in the embodiment is located on a power supply path between the automatic matching box 114 and the waveform detector 116 of the first high frequency bias supply circuit 121, and is a position where the other coaxial cable connected to the inter-electrode circuit 118 is connected to this power supply path.

When the electrical separation is not ideal, in a case where a phase difference between the value of the voltage output by the first high frequency bias power source 112 and a value of a voltage detected by the first waveform detector 116 ranges from −90 degrees to 90 degrees, the value of the voltage detected by the first waveform detector 116 is larger than the value of the voltage output by the first high frequency bias power source 112 according to the result of superimposition. When the electrical separation between the first high frequency bias supply circuit 121 and the second high frequency bias supply circuit 122 sandwiching the inter-electrode circuit 118 is ideally realized, the voltage detected by the first waveform detector 116 is equal to the voltage output by the first high frequency bias power source 112 as a minimum value. On the other hand, when the electrical separation is not ideal, in a case where the phase difference ranges from 90 degrees to 180 degrees, or from −90 degrees to −180 degrees, the voltage detected by the first waveform detector 116 is equal to the voltage output by the first high frequency bias power source 112 as a maximum value.

Similarly, in the second high frequency bias supply circuit 122, the voltage supplied to the outer peripheral side electrode 110 via the second waveform detector 117 is equal to the voltage value of power output from the second high frequency bias power source 113 in a case where the electrical separation between the first high frequency bias supply circuit 121 and the second high frequency bias supply circuit 122 sandwiching the inter-electrode circuit 118 is ideally realized. In a case where the electrical separation is not ideal, the voltage supplied to the outer peripheral side electrode 110 is a value of a voltage at a position 124 when only the second high frequency bias power source 113 is outputting superimposed on the voltage at the position 124 when only the first high frequency bias power source 112 is outputting. The position 124 in the embodiment is a position located on a power supply path between the automatic matching box 115 and the waveform detector 117 of the second high frequency bias supply circuit 122, and is a position where the other coaxial cable connected to the inter-electrode circuit 118 is connected to this power supply path.

When the electrical separation is not ideal, in a case where a phase difference between the voltage value of the power output by the second high frequency bias power source 113 and a value of a voltage detected by the second waveform detector 117 ranges from −90 degrees to 90 degrees, the value of the voltage detected by the second waveform detector 117 is larger than the voltage value of the power output by the second high frequency bias power source 113, and when the electrical separation between the first high frequency bias supply circuit 121 and the second high frequency bias supply circuit 122 sandwiching the inter-electrode circuit 118 is ideally realized, the voltage detected by the second waveform detector 117 is equal to the voltage output by the second high frequency bias power source 113 as a minimum value. Further, in a case where the phase difference ranges from 90 degrees to 180 degrees or from −90 degrees to −180 degrees, the voltage detected by the second waveform detector 117 is equal to the voltage value of power output by the second high frequency bias power source 113 as a maximum value.

Here, according to the phase difference between the voltage value of power output by the first high frequency power source 112 and the voltage value detected by the first waveform detector 116, the inductance value of the inter-electrode circuit 118 is adjusted such that the magnitude of the voltage Vpp detected by the first waveform detector 116 is the minimum value or the maximum value, and therefore, it is possible to approach the ideal electrical separation between the first high frequency bias supply circuit 121 and the second high frequency bias supply circuit 122 without mutual influence between the outputs of the high frequency power from the first high frequency bias power source 112 and the second high frequency bias power source 113. Further, according to the phase difference between the voltage value of power output by the second high frequency power source 113 and the voltage value detected by the second waveform detector 117, the inductance value of the inter-electrode circuit 118 is adjusted such that the magnitude of the voltage Vpp detected by the second waveform detector 117 is the minimum value or the maximum value, and therefore, it is possible to approach the ideal electrical separation between the first high frequency bias supply circuit 121 and the second high frequency bias supply circuit 122 without mutual influence between the outputs of the high frequency power from the first high frequency bias power source 112 and the second high frequency bias power source 113.

Next, operations for adjusting supply of high frequency power by the two high frequency bias supply circuits of the embodiment will be described in detail with reference to FIG. 2 and FIG. 3.

Figure 2:
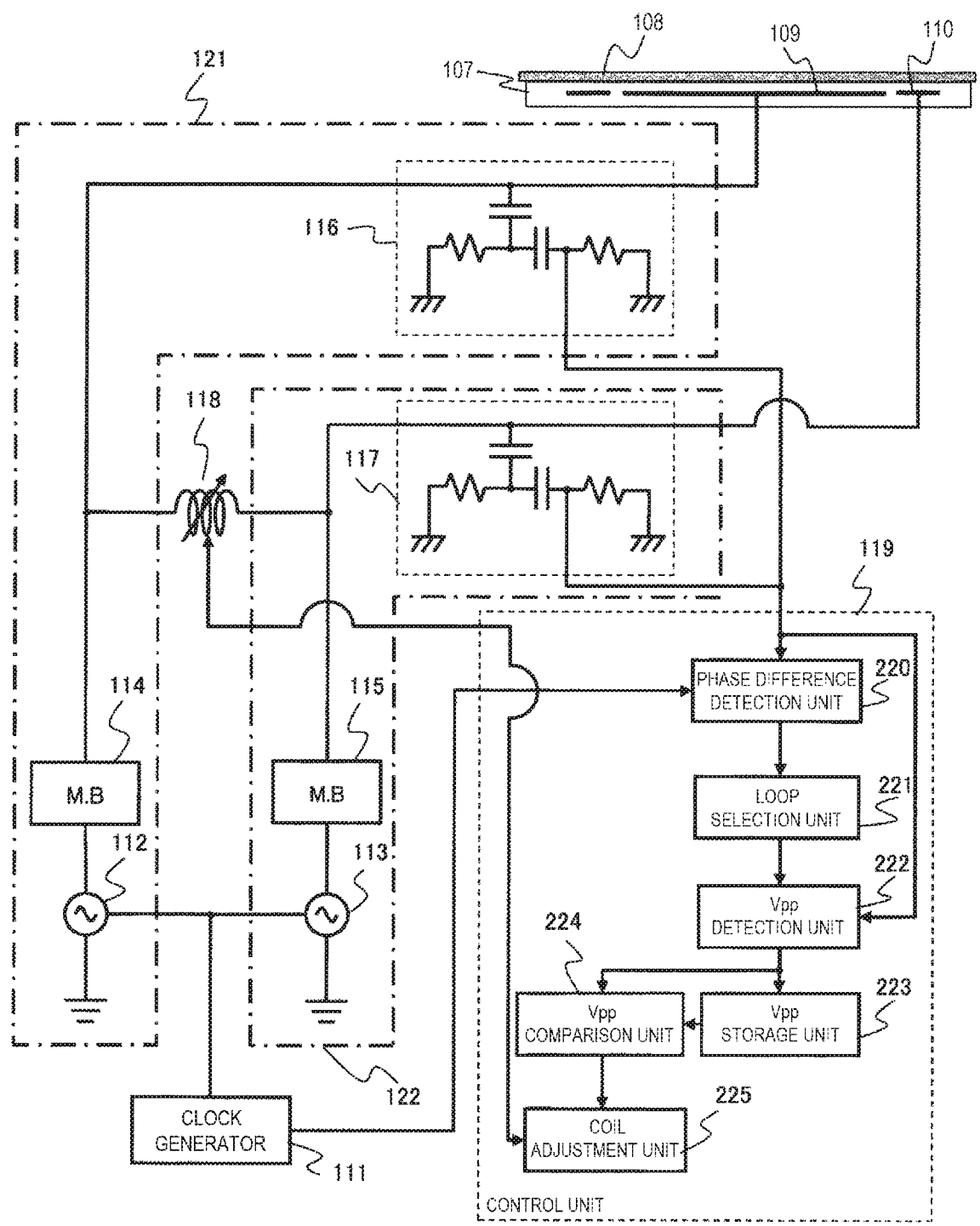
FIG. 2 is a view illustrating internal circuits and internal blocks of waveform detectors of the plasma processing apparatus according to the embodiment illustrated in FIG. 1.

FIG. 2 is a circuit and block diagram schematically illustrating an outline of a configuration of circuits in the high frequency bias supply circuits of the plasma processing apparatus according to the embodiment illustrated in FIG. 1.

In FIG. 2, internal configurations of the first waveform detector 116, the second waveform detector 117 and the control unit 119 are illustrated as the circuit and block diagram.

The first high frequency bias supply circuit 121 is connected to the center side electrode 109, and the first automatic matching box 114 and the first waveform detector 116 are sequentially disposed and electrically connected on a power supply path between the first high frequency bias power source 112 in the first high frequency bias supply circuit 121 and the center side electrode 109. The second high frequency bias supply circuit 122 is connected to the outer peripheral side electrode 110, and the second automatic matching box 115 and the second waveform detector 117 are sequentially disposed and electrically connected on a power supply path between the second high frequency bias power source 113 in the second high frequency bias supply circuit 122 and the outer peripheral side electrode 110. The inter-electrode circuit 118 is disposed between the power supply paths of the first high frequency bias supply circuit 121 and the second high frequency bias supply circuit 122 and connected thereto. The inter-electrode circuit 118 adjusts the inductance value of the variable induction coil disposed therein based on a coil inductance adjustment signal received from the control unit 119.

Further, the first high frequency bias power source 112 and the second high frequency bias power source 113 separately output high frequency bias power of a predetermined frequency at a time point in synchronization with pulsed clock signals output from a clock generator 111 at a predetermined period. The first high frequency bias power source 112 and the second high frequency bias power source 113 outputs the high frequency power in a manner of repeating multiple times of a cycle during the treatment of the wafer 108, the cycle being a combination of one period of continuously outputting power with an amplitude of a predetermined magnitude and one period of continuously outputting power with a smaller amplitude or setting the output to zero according to a clock signal. That is, the period during which the amplitude is set to a predetermined value, and the subsequent period during which the amplitude is smaller than the predetermined value or is set to zero, is predetermined to be integral multiples of the period of the clock signal. The high frequency power output by the high frequency bias power sources may not be the same in terms of the length of two periods or the amplitude of the voltage or current, and may be appropriately selected by the user of the plasma processing apparatus 100 according to required conditions of the etching treatment of the wafer 108.

At any time point during the treatment of the wafer 108, when either one of or both of the first high frequency bias power source 112 and the second high frequency bias power source 113 is outputting the high frequency bias power with large amplitude, the first waveform detector 116 and the second waveform detector 117 continue to divide the voltage value of the high frequency bias power and output the voltage value to the control unit 119 power as a voltage waveform signal separately. In the embodiment, either the voltage waveform signal output from the first waveform detector 116 or the voltage waveform signal output from the second waveform detector 117 may be used in an arithmetic operation in the control unit 119 to be described below. In the embodiment, an example in which the voltage waveform signal output from the first waveform detector 116 is used in the arithmetic operation of the instruction signal in the control unit 119 to be described below.

As illustrated in FIG. 2, the control unit 119 includes: a phase difference detection unit 220 that receives outputs indicating the voltage values from the first waveform detector 116 and the second waveform detector 117, and detects the phase difference between the high frequency power supplied to the center side electrode 109 via the first high frequency bias supply circuit 121 and the high frequency power supplied to the outer peripheral side electrode 110 via the second high frequency bias supply circuit 122; and a loop selection unit 221 that receives a signal indicating the phase difference from the phase difference detection unit 220, determines to which range the magnitude of the phase difference belongs, and selects a flow of subsequent operations based on the result of the determination. In addition, the phase difference detection unit 220 is communicably connected to the clock generator 111 so as to receive a clock signal transmitted from the clock generator 111.

The control unit 119 also includes: a Vpp detection unit 222 that receives a signal indicating a voltage value output from the first waveform detector 116 or the second waveform detector 117 and detects the magnitude of the amplitude (peak-to-peak, Vpp) at any time point during the treatment of the wafer 108; a Vpp storage unit 223 that stores a data signal indicating the detected Vpp value in a memory such as an internal RAM or ROM, or a storage medium such as a CD-ROM drive; and a Vpp comparison unit 224 that compares Vpp values which are stored in the Vpp storage unit 223 and correspond to different time points during the treatment, and detects and outputs the differences. The control unit 119 further includes a coil adjustment unit 225 that receives the output from the Vpp comparison unit 224 and transmits a signal indicating an inductance value of the inter-electrode circuit 118. The Vpp comparison unit 224 is configured to communicate with the Vpp detection unit 222 so as to receive the signal indicating the voltage value corresponding to any time point during the treatment which is detected and output by the Vpp detection unit.

In the embodiment illustrated in FIG. 2, different operations performed sequentially along the flow of signal transmitting and receiving in the control unit 119 are displayed as a plurality of blocks, and the operation of each block may be performed by different devices and machines at different positions. Alternatively, one arithmetic unit in one semiconductor device reads out software pre-stored in a storage unit in the control unit 119, calculates data and instruction signals for the operation object of each block according to an algorithm of the software, and transmits the calculated result to a signal storage unit for storing; and the arithmetic unit reads out the stored data according to an algorithm of software corresponding to the operation of next block, and calculates data and instruction signals for the operation object of the next block. Thereby, each operation of the plasma processing apparatus 100 may be controlled by the control unit 119.

Next, a flow of operations, based on the instruction signal from the control unit 119, of the plasma processing apparatus 100 according to the embodiment will be described with reference to both FIG. 2 and FIG. 3. FIG. 3 is a flow chart illustrating the flow of operations based on the instruction signal from the control unit of the plasma processing apparatus according to the embodiment illustrated in FIG. 1.

The first waveform detector 116 and the second waveform detector 117 of the embodiment are configured to detect a voltage or a current waveform of the high frequency power in each power supply path at each time point during a sampling period, the sampling period being an interval of a predetermined time during the treatment of the wafer 108.

The operations to be described below of the plasma processing apparatus 100 according to the embodiment is based on the high frequency power detected at each time point tn during the sampling period from a time point when the detection starts, before or after starting the treatment of the wafer 108.

First, in the control unit 119, the phase difference detection unit 220 receives a signal output from the first waveform detector 116 and indicating a voltage waveform of the high frequency power corresponding to any time point tn during the treatment of the wafer 108, and a clock signal output from the clock generator 111; and calculates a phase difference $\delta\Phi=\Phi_{V1}-\Phi_{VRF1}$ between the clock signal serving as a reference cycle of the high frequency power and the high frequency power output from the first waveform detector 116 and supplied to the center side electrode 109 from the first high frequency bias supply circuit 121 based on the two received signals (step 301). The time point tn indicates any time point of the sampling period corresponding to a symbol n that indicates the number of times of the detection repeated from the detection start time point.

In the loop selection unit 221, a signal indicating 5 output from the phase difference detection unit 220 is received, and whether the phase difference $\delta\Phi$ ranges from −90 degrees to 90 degrees (a first range) is determined. In the loop selection unit 221, in a case where it is determined that the phase difference $\delta\Phi$ is within the first range, a loop control 313 is selected, which is a flow of a series of operations for adjusting a circuit constant of the inter-electrode circuit 118 so that the value of Vpp that is the amplitude of the signal indicating the voltage waveform output from the first waveform detector 116 becomes the minimum value; and in a case where it is determined that the phase difference $\delta\Phi$ is not within the first range of −90 degrees to 90 degrees (a case of a second range, from 90 degrees to 180 degrees or from −90 degrees to −180 degrees), a loop control 314 (represented by A in FIG. 3) is selected, which is a flow of a series of operations for adjusting the circuit constant of the inner-electrode circuit 118 so that Vpp of the signal indicating the waveform output from the first waveform detector 116 becomes the maximum value (step 302).

The case where the loop control 313 is selected will be described below. During the time of operating the loop control selected in step 302 using data of the voltage waveform of the high frequency power corresponding to any time point tn during the treatment and detected by the first waveform detector 116, and also during the period after a time point following the next sampling period of any time point tn, operations of detecting the phase difference $\delta\Phi$ and operations of selecting a loop according to the detected value are performed in step 301 and step 302 in the control unit 119. In a case where it is detected that a result determined in step 302 on whether the magnitude of the phase difference $\delta\Phi$ corresponding to any time point tn belongs to the first range or the second range is changed from the one at the time point tn−1 (one detection period before), the control unit 119 accordingly selects a loop control different from the loop control which is selected according to the result of determination of the phase difference $\delta\Phi$ corresponding to the time point tn−1, and performs the operations correspondingly.

In the loop control 313, the control unit 119 first receives a signal indicating the voltage waveform corresponding to any time point tn during the treatment of the wafer 108 output from the first waveform detector 116 in the Vpp detection unit 222, detects the value Vpp of the amplitude, and stores the signal indicating the value Vpp in the Vpp storage unit 223. At this time, in step 303, the control unit 119 first determines whether an amplitude Vpp(n−1) of the voltage of the high frequency power corresponding to the time point tn−1 is stored in the Vpp storage unit 223 (step 303). At this time, in a case where it is determined that amplitude Vpp(n−1) is stored in the Vpp storage unit 223, the process proceeds to step 306 that is to be described below. On the other hand, in a case where it is detected that amplitude Vpp(n−1) is not stored in the Vpp storage unit 223, the arithmetic unit of the control unit 119 transmits an instruction signal to the phase difference detection unit 222, detects the amplitude Vpp of the voltage of the high frequency power corresponding to time point tn−1 from data of waveform output from the first waveform detector 116 (step 304), and stores the signal indicating the value Vpp transmitted to the Vpp storage unit 223 as Vpp(n−1) (step 305).

Further, the arithmetic unit determines whether data indicating a value $\Delta VL(n)$ that serves as a unit amount for changing the inductance of the variable inductance coil in the inter-electrode circuit 118 corresponding to the time point tn, is stored in the storage unit in the control unit 119 (step 306). In a case where it is determined that the data is stored in the storage unit, the process proceeds to step 308. On the other hand, in a case where it is determined that the data is not stored in the storage unit, the process proceeds to step 307, and a predetermine value $\delta$ is transmitted to the storage unit and stored as the unit amount for changing the inductance.

Next, in step 308, the control unit 119 transmits an instruction signal to the inter-electrode circuit 118 to change the inductance of the variable inductance coil therein by the value $\Delta VL(n)$. Further, after it is detected that the inductance of the variable inductance coil is changed, an instruction signal is transmitted to the Vpp detection unit 222, and the amplitude Vpp is detected based on the signal of the voltage waveform of the high frequency power corresponding to the time point to (step 309). The signal indicating the detected amplitude Vpp is output to the Vpp storage unit 223, and data indicating the value Vpp indicated by the signal is stored in the storage unit 223 as Vpp(n) (step 310).

Next, the signal indicating the amplitude Vpp(n) detected and output in the Vpp detection unit 222 is transmitted to the Vpp comparison unit 224, and further in step 311, the signal indicating data of the Vpp(n−1) stored in the Vpp storage unit 223 is transmitted to the Vpp comparison unit 224 and received thereby. In the Vpp comparison unit 24, Vpp(n)−Vpp(n−1), which is the difference between the signals, is calculated, and whether the magnitude thereof belongs to a predetermined range is determined. In the embodiment, whether the difference Vpp(n)−Vpp(n−1) is equal to or less than 0 is determined.

The coil adjustment unit 225 receives a signal indicating a result determined by the Vpp comparison unit 224 in step 311, transmits a coil adjustment signal to the inter-electrode circuit 118 corresponding to the signal, and increases or decreases the inductance value of the variable inductance coil of the inter-electrode circuit 118. That is, regarding the result of the determination on whether a value of the difference indicated by the signal from the Vpp comparison unit 224 is equal to or less than 0, in a case where it is determined that the value of the difference is equal to or less than 0, the process returns to step 308 and the inductance value of the variable inductance coil is changed by $\Delta VL(n)$. Thereafter, steps 309 to 311 are repeated.

On the other hand, in a case where it is determined that the value of the difference is greater than 0, the process proceeds to step 312. In step 312, a direction of increasing or decreasing the inductance value of the variable inductance coil is reversed, and the magnitude of an absolute value of the changed unit amount in the reversed direction is decreased by a predetermined ratio and stored as a new ΔVL(n). Thereafter, the process proceeds to step 308, and the coil adjustment unit 225 transmits an instruction signal to the variable inductance coil to drive change of the inductance value, and then the steps 309 to 311 are repeated similarly.

Figure 4:
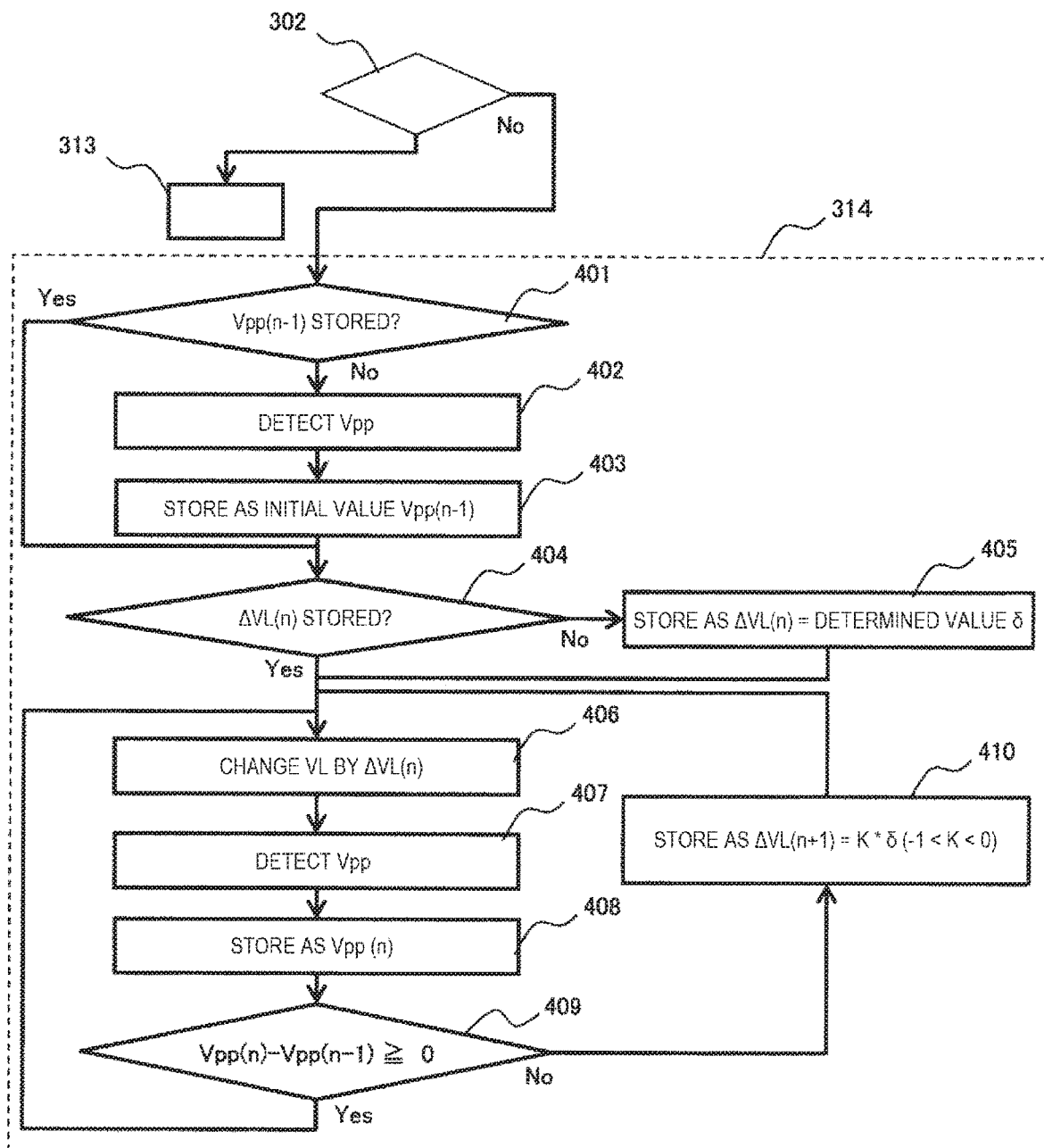
FIG. 4 is a flow chart illustrating a flow of other operations based on instruction signals from the control unit of the plasma processing apparatus according to the embodiment illustrated in FIG. 2.

The operations of the loop control 314, which is selected in step 302 in the case where it is determined that the phase difference δΦ is not within the first range of −90 degrees to 90 degrees (a case of the second range, from 90 degrees to 180 degrees or from −90 degrees to −180 degrees) will be described below with reference to FIG. 4. The loop control 314 is a flow of series of operations for adjusting the circuit constant of the inner-electrode circuit 118 so that Vpp of the signal indicating the waveform output from the first waveform detector 116 is the maximum value. FIG. 4 is a flow chart illustrating a flow of other operations based on the instruction signal from the control unit of the plasma processing apparatus according to the embodiment illustrated in FIG. 2.

Figure 3:
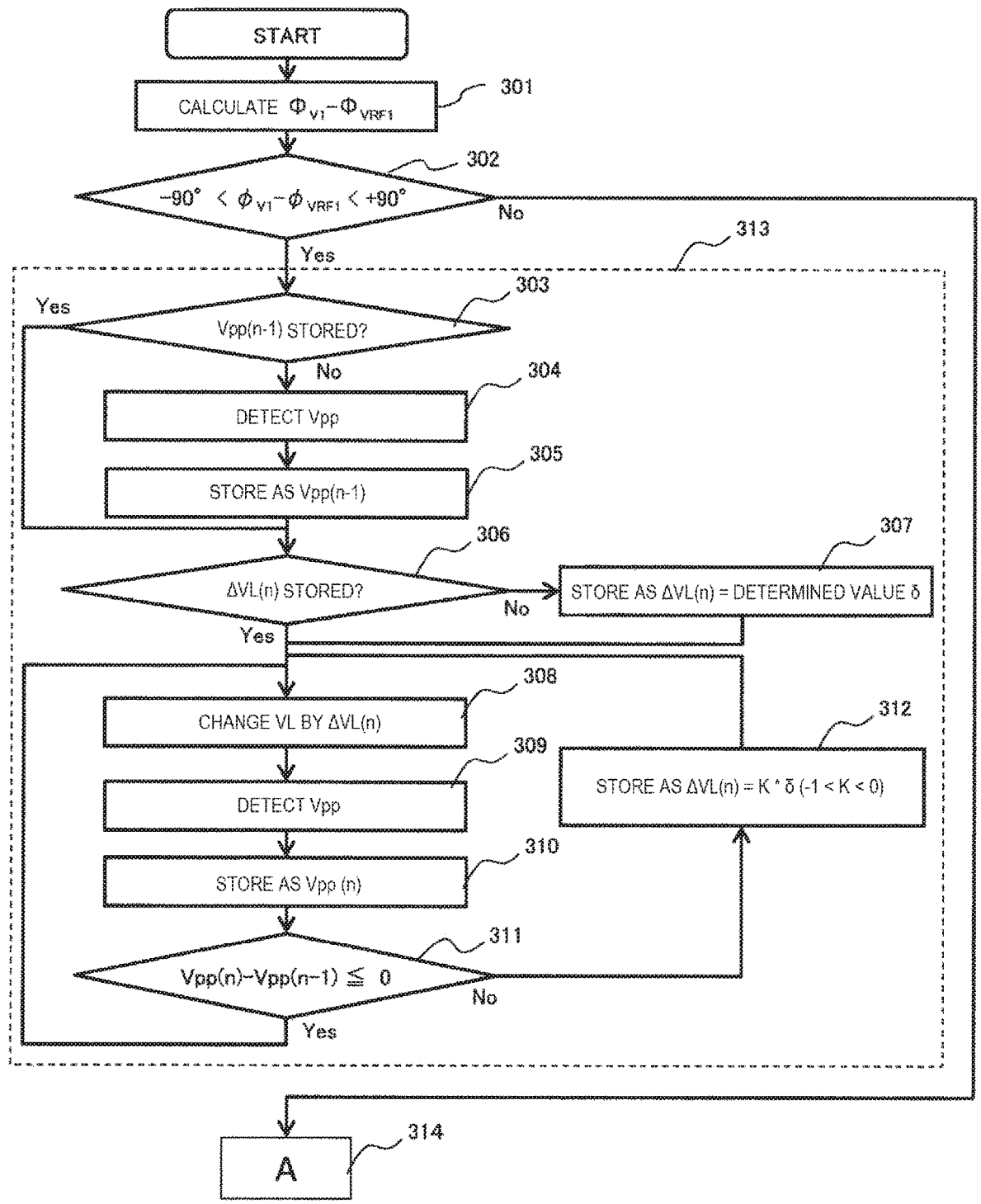
FIG. 3 is a flow chart illustrating a flow of operations by a control unit of the plasma processing apparatus according to the embodiment illustrated in FIG. 2.

The series of operations in the loop control 314 are performed along the same flow as that of the loop control 313 as illustrated in FIG. 3. The control unit 119 first receives the signal indicating the voltage waveform corresponding to any time point to during the treatment of the wafer 108 output from the first waveform detector 116 in the Vpp detection unit 222, detects the value Vpp of the amplitude, and stores the signal indicating the value Vpp in the Vpp storage unit 223. At this time, in step 401, the control unit 119 first determines whether Vpp(n−1) is stored in the Vpp storage unit 223 (step 401). At this time, in a case where it is detected that Vpp(n−1) is stored in the Vpp storage unit 223, the process proceeds to step 406 that is to be described below. On the other hand, in a case where it is detected that Vpp(n−1) is not stored in the Vpp storage unit 223, the amplitude Vpp of the voltage of the high frequency power corresponding to the time point tn−1 is detected corresponding to an instruction signal from the arithmetic unit of the control unit 119 (step 402), and the signal indicating the value Vpp transmitted to the Vpp storage unit 223 is stored as Vpp(n−1) (step 403).

Further, the arithmetic unit determines whether data of unit amount ΔVL(n) for changing the inductance value of the variable inductance coil of the inter-electrode circuit 118 corresponding to the time point tn is stored (step 404). In a case where the data is stored, the process proceeds to step 406. On the other hand, in a case where the data is not stored, the process proceeds to step 405 in which the predetermined value δ is stored as ΔVL(n).

Next, in step 406, the inductance of the variable inductance coil in the inter-electrode circuit 118 is increased or decreased by the value ΔVL(n). Further, the amplitude Vpp of the voltage of the high frequency power corresponding to the time point tn is detected in the Vpp detection unit 222 (step 407). The value of the detected amplitude Vpp is stored in the Vpp storage unit 223 as Vpp(n) (step 408).

Next, the value of the amplitude Vpp (n) is compared with the value Vpp(n−1) stored in the Vpp storage unit 233 by the Vpp comparison unit 224, the difference between the values that is Vpp(n)−Vpp(n−1) is calculated, and whether the difference belongs to the predetermined range is determined (step 409). In the loop control 314, whether Vpp(n)−Vpp (n−1) is equal to or greater than 0 is determined.

In a case where the result determined by the Vpp comparison unit 225 is that the value of the difference is equal to or greater than 0, the process returns to step 406 and the inductance value of the variable inductance coil is changed by ΔVL(n) by the coil adjustment unit 225. Thereafter, steps 407 to 409 are repeated. On the other hand, in a case where it is determined that the value of the difference is less than 0, the process proceeds to step 410, a direction of increasing or decreasing the inductance value of the variable inductance coil is reversed, and the magnitude of an absolute value of the changed unit amount of the inductance value is decreased by the predetermined ratio and stored as a new ΔVL(n). Thereafter, the process proceeds to step 406, the coil adjustment unit 225 changes the inductance value, and then the steps 407 to 409 are repeated similarly.

As described above, in the embodiment, the inductance value of the variable inductance coil in the inter-electrode circuit 118 that is disposed between and connects the two high frequency bias supply circuits 121, 122 is adjusted by using the Vpp of the voltage waveform signal and the phase difference between the clock signal generated by the clock generator 111 and the voltage waveform signal from the waveform detectors 116 or 117 that are disposed on the power source side of the connection points with the inter-electrode circuit 118 on the power supply path of the high frequency bias supply circuit 121 to the center side electrode 109 and the power supply path of the high frequency bias supply circuit 122 to the outer peripheral side electrode 110 respectively. Accordingly, even in a case where the high frequency power is output from the two high frequency bias power sources 112, 113 at the same time, the ideal electrical separation between the two high frequency bias supply circuits 121, 122 can be approached by adjusting the inductance value of the inter-electrode circuit 118.

Accordingly, when generating the plasma in the treatment chamber 103, an adjustment flow of the inter-electrode circuit 118 can be reduced, and the influence on the etching rate of the film layer to be treated on the upper surface of the wafer 108 can be lowered when only one of the high frequency bias power sources outputs the high frequency power. Further, the high frequency bias power supplied to the separate center side electrode 109 and the outer peripheral side electrode 110 can be adjusted to lower the mutual influence, and further the influence by conditions of the plasma can also be lowered. As a result, variations in the etching treatment in the in-plane direction of the wafer 108 can be reduced and the yield of the treatment can be improved.

What is claimed is:

1. A plasma processing method for treating a wafer placed on an upper surface of a sample table by using plasma generated in a treatment chamber of a plasma processing apparatus, the plasma processing apparatus including
a vacuum container that includes the treatment chamber therein;
the sample table that is disposed in the treatment chamber and having the upper surface upon which a wafer to be treated is placed;
two electrodes that are disposed in a film being made of dielectric material and which form the upper surface of the sample table, and which are disposed at a lower side of a center part and an area on an outer peripheral side of the center part on the upper surface of the sample table, respectively;
two high frequency power sources that supply high frequency power to said two electrodes, respectively;

two matching boxes that are each respectively disposed on two power supply paths that electrically connect said two electrodes and the two high frequency power sources, respectively; and a connection path that electrically connects positions between each said matching box on each said power supply path and each said electrode via a coil, the method comprising:

adjusting an inductance of the coil according to a magnitude of a phase difference between the high frequency power flowing through each of said two power supply paths which is obtained by using a result of detection of a magnitude of a voltage or a current of the high frequency power flowing through each of said two power supply paths during treating of the wafer, the inductance of the coil being adjusted such that the voltage of the high frequency power flowing through one of said two power supply paths becomes a maximum value or a local minimum value.

2. The plasma processing method according to claim 1, wherein the two electrodes, the two power supply paths, and the connection path configure a resonance circuit by adjusting the inductance of the coil.

3. The plasma processing method according to claim 1, wherein said adjustment is performed such that in a case where the phase difference is within a range from −90 degrees to 90 degrees, the inductance of the coil is adjusted so that the minimum value is detected, and in a case where the phase difference is within a range from 90 degrees to 180 degrees or from −90 degrees to −180 degrees, the inductance of the coil is adjusted so that the maximum value is detected.

4. The plasma processing method according to claim 1, wherein the two electrodes are disposed in the center part and an area surrounding the outer peripheral side of the center part in a ring shape, respectively.

* * * * *